(12) United States Patent
Zhu et al.

(10) Patent No.: US 12,167,576 B2
(45) Date of Patent: Dec. 10, 2024

(54) CASING AND ELECTRONIC DEVICE

(71) Applicant: ZTE CORPORATION, Guangdong (CN)

(72) Inventors: Zhifeng Zhu, Guangdong (CN);
Zhaoheng Liu, Guangdong (CN);
Dongsheng Me, Guangdong (CN)

(73) Assignee: ZTE CORPORATION, Guangdong (CN)

( * ) Notice: Subject to any disclaimer, the term of this patent is extended or adjusted under 35 U.S.C. 154(b) by 189 days.

(21) Appl. No.: 17/928,378

(22) PCT Filed: Jun. 24, 2021

(86) PCT No.: PCT/CN2021/102101
§ 371 (c)(1),
(2) Date: Nov. 29, 2022

(87) PCT Pub. No.: WO2021/259360
PCT Pub. Date: Dec. 30, 2021

(65) Prior Publication Data
US 2023/0225089 A1 Jul. 13, 2023

(30) Foreign Application Priority Data

Jun. 24, 2020 (CN) .......................... 202010589070.0

(51) Int. Cl.
G06F 1/16 (2006.01)
H04Q 1/02 (2006.01)
(Continued)

(52) U.S. Cl.
CPC ......... *H05K 7/20563* (2013.01); *H04Q 1/025* (2013.01); *H04Q 1/035* (2013.01); *H05K 7/20581* (2013.01)

(58) Field of Classification Search
CPC ........... H05K 7/20563; H05K 7/20581; H05K 7/20572; H05K 7/2059; H05K 7/20554;
(Continued)

(56) References Cited

U.S. PATENT DOCUMENTS

| 7,286,345 | B2 * | 10/2007 | Casebolt | ............ H05K 7/20736 361/679.48 |
| 8,223,492 | B2 * | 7/2012 | Ji | ....................... H05K 7/20572 361/679.48 |

(Continued)

FOREIGN PATENT DOCUMENTS

| CN | 101516166 A | 8/2009 |
| CN | 103079386 A | 5/2013 |

(Continued)

OTHER PUBLICATIONS

WIPO, International Search Report issued on Aug. 3, 2021.

*Primary Examiner* — Anthony M Haughton
(74) *Attorney, Agent, or Firm* — Li & Cai Intellectual Property (USA) Office

(57) ABSTRACT

There is provided a casing, adapted to a board having a first air vent and a second air vent, including: a base plate; a first side plate and a second side plate provided on a first side and a second side of the base plate, respectively, with both the first side plate and the second side plate having hollowed-out patterns, and after the board being fixed in the casing, the first side plate being opposite to the first air vent, and the second side plate being opposite to the second air vent; a connection backplate on a fourth side of the base plate; and at least one insert plate on the base plate, with an extension direction in which the insert plate extends intersecting with an extension direction in which a third side of the base plate extends. An electronic device including the casing described above is further provided.

12 Claims, 8 Drawing Sheets

(51) Int. Cl.
*H05K 5/00* (2006.01)
*H05K 7/00* (2006.01)
*H05K 7/20* (2006.01)

(58) Field of Classification Search
CPC .............. H05K 7/20536; H05K 7/206; H05K 7/20609; H05K 7/20618; H04Q 1/025; H04Q 1/035
See application file for complete search history.

(56) References Cited

U.S. PATENT DOCUMENTS

| | | | |
|---|---|---|---|
| 8,514,571 | B2 | 8/2013 | Ji et al. |
| 11,432,434 | B2* | 8/2022 | Lee ...................... H05K 7/1491 |
| 2010/0159816 | A1* | 6/2010 | Huels ................ H05K 7/20727 |
| | | | 454/184 |
| 2010/0254085 | A1* | 10/2010 | Hasegawa .......... H05K 7/20136 |
| | | | 361/695 |
| 2010/0254086 | A1* | 10/2010 | Ikeda ................ H05K 7/20163 |
| | | | 361/697 |
| 2014/0036439 | A1* | 2/2014 | Huang ............... H05K 7/20727 |
| | | | 361/692 |
| 2023/0051026 | A1* | 2/2023 | Krammer ............ H05K 7/2039 |

FOREIGN PATENT DOCUMENTS

| | | |
|---|---|---|
| CN | 104602498 A | 5/2015 |
| CN | 206547232 U | 10/2017 |

\* cited by examiner

CASING AND ELECTRONIC DEVICE

CROSS-REFERENCE TO RELATED APPLICATION

The present application claims the priority of Chinese Patent Application No. 202010589070.0 filed on Jun. 24, 2020, the contents of which are incorporated herein in their entirety by reference.

TECHNICAL FIELD

The present disclosure relates to the field of communication technology, and in particular to a casing and an electronic device.

BACKGROUND

As the market trend is highly sensitive to large and medium-scale routing and switching equipment, an orthogonal architecture comes into being, which determines that an air passage of this architecture is a front-rear air passage. However, air passages of previously developed boards were air passages adapted to systems at that time, and most of the air passages of the boards were left-right air passages. For major market customers—operators, downward compatibility of the boards is almost a strong demand. Obviously, without changing any heat dissipation measure, the boards with the left-right air passages cannot be compatible with the air passage applied to the orthogonal architecture. Meanwhile, with the continuous increase of traffic capacity of the system, the increase in the number of slots for switching network boards will bring about a problem of thermal cascade of front and rear boards. In the presence of thermal cascade, there is a problem in how to take into account the heat dissipation of the switching network board downstream of the air passage in a case where the board with the left-right air passages is used together with the air passage of the orthogonal architecture.

SUMMARY

In a first aspect, an embodiment of the present disclosure provides a casing, adapted to a board having a first air vent and a second air vent, including: a base plate having a first side and a second side opposite to each other, and a third side and a fourth side opposite to each other and connected between the first side and the second side; a first side plate and a second side plate provided on the first side and the second side of the base plate, respectively, with both the first side plate and the second side plate having hollowed-out patterns, and after the board being fixed in the casing, the first side plate being opposite to the first air vent of the board, and the second side plate being opposite to the second air vent of the board; a connection backplate provided on the fourth side of the base plate; and at least one insert plate provided on the base plate, with an extension direction in which the insert plate extends intersecting with an extension direction in which the third side of the base plate extends.

In a second aspect, an embodiment of the present disclosure provides an electronic device including the casing and the board described above, where the board is fixed in the casing.

BRIEF DESCRIPTION OF DRAWINGS

The accompanying drawings, which are a part of the specification, are used to provide a further understanding of the present disclosure, and serve to explain the present disclosure together with following implementations, but do not constitute a limitation to the present disclosure. In the drawings.

DETAIL DESCRIPTION OF EMBODIMENTS

It should be understood that embodiments described herein are only used to explain the present disclosure, but not to limit the present disclosure.

Unless otherwise defined, technical or scientific terms used in this disclosure shall have the ordinary meaning as understood by one of ordinary skill in the art to which this disclosure belongs. As used in this disclosure, words such as "first", "second" do not denote any order, quantity, or importance, but are merely used to distinguish the various components. Likewise, words such as "a", "an" or "the" do not denote a limitation of quantity, but rather denote the presence of at least one. Words such as "comprising" or "including" mean that the elements or things appearing before the word encompass the elements or things recited after the word and their equivalents, but do not exclude other elements or things. Words such as "connecting" or "connected" are not limited to physical or mechanical connections, but may include electrical connections, whether direct or indirect. Words such as "up/on", "down/below", "left", "right", etc. are only used to represent the relative positional relationship, and when the absolute position of the described object changes, the relative positional relationship may also change accordingly.

Figure 1:
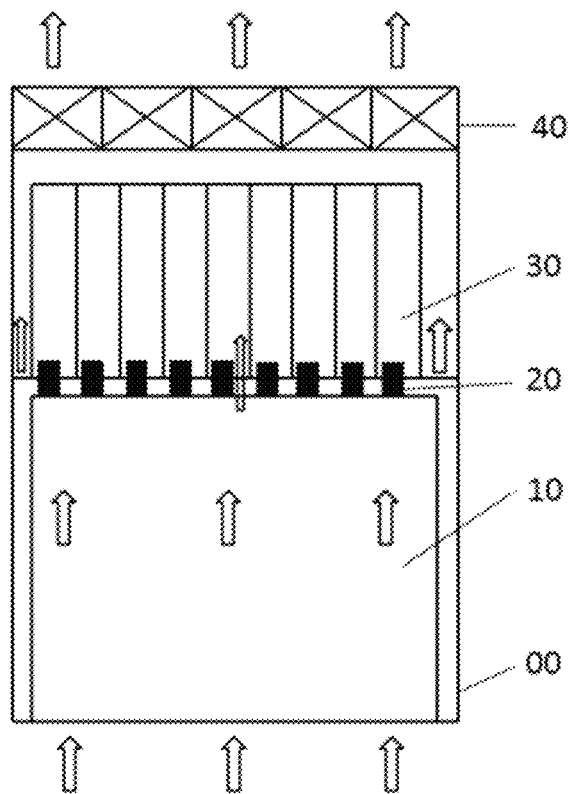
FIG. 1 is a top view of an exemplary electronic device.
Figure 2:
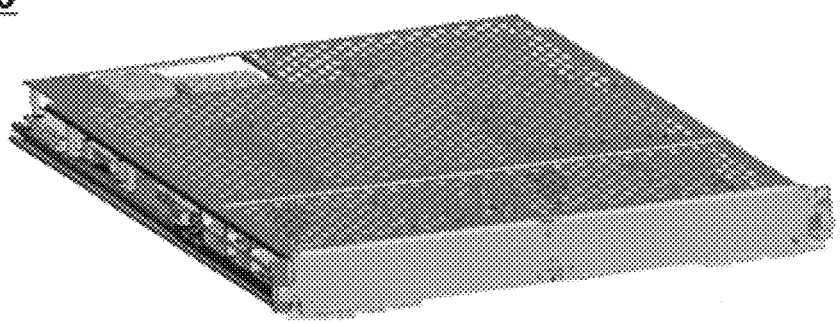
FIG. 2 is a schematic diagram of an exemplary board.

An exemplary electronic device includes, but is not limited to, a switch. In the following description, description is made by taking an example that the electronic device is a switch. As shown in FIG. 1, the switch includes a chassis 00, a connector 20 disposed in the chassis 00, and a board 10 (which may be a service line board) and a network board 30 which are located on front and rear sides of a connection backplate, respectively. The board 10 and the network board 30 are arranged in an orthogonal architecture, and are connected through the connector 20. In order to achieve heat dissipation, a fan 40 is further provided in the chassis 00, and the fan 40 is located on a side of the network board 30 away from the board 10. Accordingly, air passages adapted to the fan 40 are formed in the board 10 and the network board 30. Through researches, it is found that, in the electronic device with the orthogonal architecture, the board 10 and the network board 30 both use front-rear air passages, so that the fan 40 can divert the wind and dissipate the heat of the electronic device. In other related products, the board 10 uses left-right air passages. As shown in FIG. 2, if the board 10 with the left-right air passages is applied to a switch, the direction of each air passage of the board 10 is different from the direction of an air flow of the fan 40, so that the board 10 cannot effectively dissipate heat.

In order to effectively dissipate heat in a case where the board 10 with the left-right air passages is applied to an electronic device with an orthogonal architecture, following technical solutions are provided in the embodiments of the present disclosure.

Figure 3:
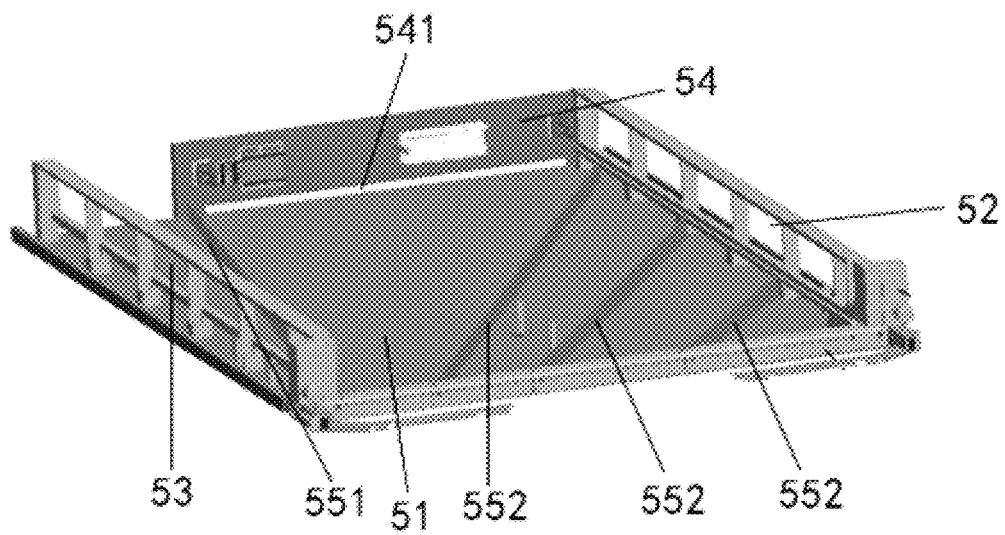
FIG. 3 is a structural diagram of a casing according to the present disclosure.

In a first aspect, as shown in FIG. 3, an embodiment of the present disclosure provides a casing 50 which is adapted to the board 10. The board 10 has a first air vent and a second air vent; one of the first air vent and the second air vent is an air inlet, the other of the first air vent and the second air vent is an air outlet, and the air inlet and the air outlet form an air passage. The casing 50 in the embodiment of the present disclosure includes: a base plate 51, a first side plate 52, a second side plate 53, a connection backplate 54, and at least one insert plate.

Figure 4:
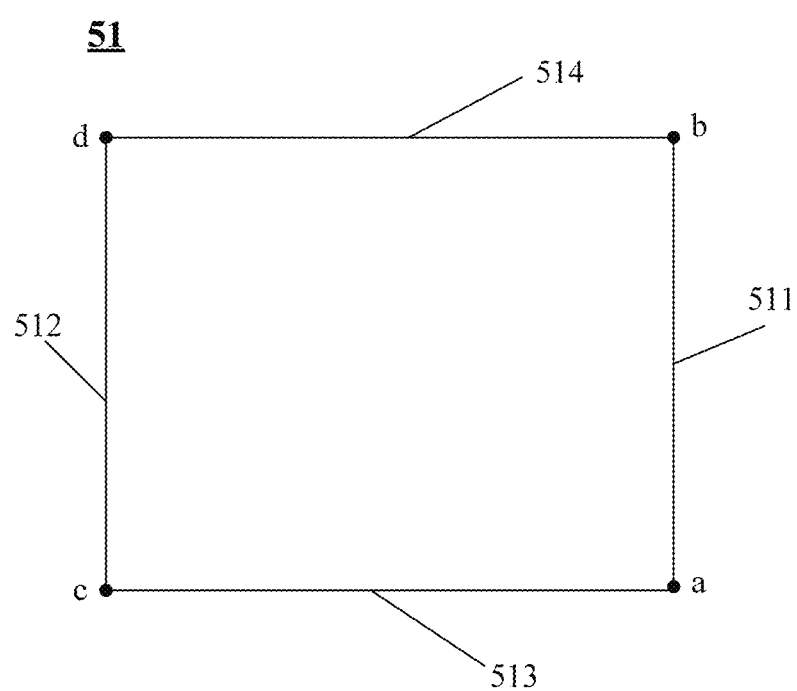
FIG. 4 is a top view of a base plate of a casing according to the present disclosure.

As shown in FIG. 4, the base plate 51 is a rectangular base plate 51, and includes a first side 511 and a second side 512 opposite to each other, and a third side 513 and a fourth side 514 opposite to each other and connected between the first side 511 and the second side 512. A connection point at which the first side 511 and the third side 513 are connected is a first connection point a; a connection point at which the first side 511 and the fourth side 514 are connected is a second connection point b; a connection point at which the second side 512 and the third side 513 are connected is a third connection point c; and a connection point at which the second side 512 and the fourth side 514 are connected is a fourth connection point d.

The first side plate 52 and the second side plate 53 both have hollowed-out patterns, and are correspondingly provided on the first side 511 and the second side 512 of the base plate 51, respectively. The hollowed-out patterns of the first side plate 52 and the second side plate 53 may be square openings, and after the board 10 is fixed in the casing 50, the hollowed-out patterns of the first side plate 52 and the second side plate 53 are opposite to the first air vent and the second air vent of the board 10, respectively.

The connection backplate 54 is connected on the fourth side 514 of the base plate 51, and is used to connect the board 10 with the network board 30.

The insert plate is provided on the base plate 51, an extension direction in which the insert plate extends intersects with an extension direction in which the third side 513 of the base plate 51 extends, and the insert plate is inclined relative to the base plate 51.

It should be noted here that, the first side 511 and the second side 512 of the base plate 51 are provided with clamping parts, respectively. After the board 10 is fixed in the casing 50, the casing 50 is inserted into the chassis 00. The clamping parts of the base plate 51 are adapted to fixing parts of side walls of the chassis 00, so that the board 10 is fixed in the chassis 00. As an example, the fixing parts of the side walls of the chassis 00 may be sliding chutes, and the clamping parts are fixed in the sliding chutes, so that the board 10 is fixed in the chassis 00. After the casing 50 is fixed in the chassis 00, there is a certain distance between the first side plate 52 of the casing 50 and the side wall of the chassis 00 corresponding to the first side plate 52 of the casing 50, and between the second side plate 53 of the casing 50 and the side wall of the chassis 00 corresponding to the second side plate 53 of the casing 50.

In the embodiment of the present disclosure, the casing 50 is adapted to the board 10 with the left-right air passages, and the casing 50 is provided with the insert plate, and the insert plate is inclined relative to the base plate 51 (for example, the extension direction in which the insert plate extends intersects with extension directions in which the first side 511 and the third side 513 of the base plate 51 extend). Therefore, after the board 10 is inserted into the chassis 00 through the casing 50, and after the fan 40 at the rear side of the chassis 00 is turned on, the wind enters from the front side of the chassis 00 and blows to the insert plate under the action of the fan 40; and due to the influence of the insert plate, after the wind blows from the hollowed-out pattern of the first side plate 52 to the side wall of the chassis 00 opposite to the first side plate 52, the direction of the wind changes, and in such case, the wind blows from the first air vent of the board 10 to the second air vent to dissipate the heat of the board 10. That is to say, if the board 10 with the left-right air passages is fixed to the casing 50 first, and then is applied to the electronic device with the orthogonal architecture, good heat dissipation can be achieved.

Figure 5:
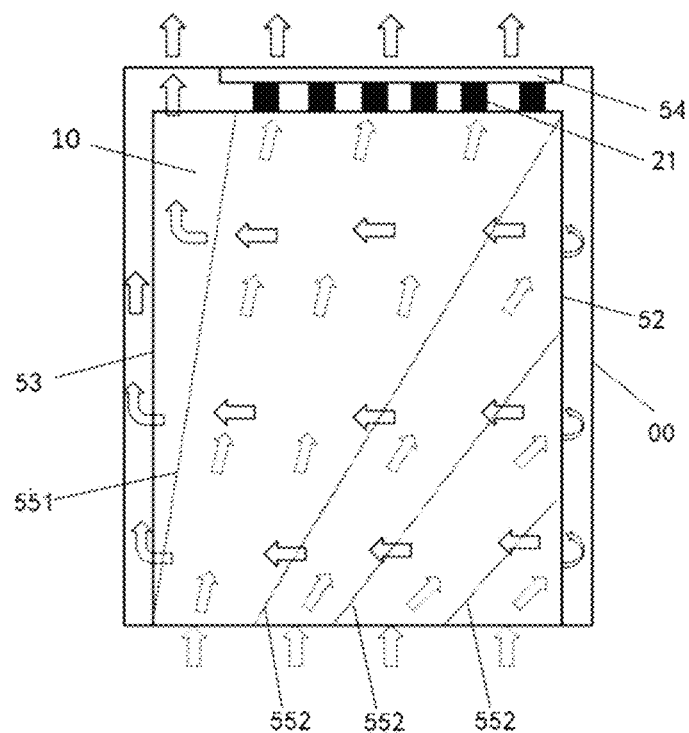
FIG. 5 is a top view of an example of a casing according to the present disclosure.

In an example, the first air vent of the board 10 is an air inlet, and the second air vent of the board 10 is an air outlet. As shown in FIG. 5, there are multiple insert plates in the casing 50, one of the insert plates is the first insert plate 551, and each remaining insert plate is the second insert plate 552; there may be one or more second insert plates 552. In FIG. 5, description is made by taking an example that there are three second insert plates 552. The connection backplate 54 of the casing 50 is connected on the fourth side 514 of the base plate 51, a first end of the connection backplate 54 is connected to the second connection point b, there is a certain distance between a second end of the connection backplate 54 and the fourth connection point d, and an opening is provided in the connection backplate 54. A connector of the board 10 is connected to the connection backplate 54. A first connection end of the first insert plate 551 is connected to the third connection point c, and a second connection end of the first insert plate 551 is connected to the fourth side 514 of the base plate 51 and corresponds to the second end of the connection backplate 54. The second insert plates 552 are arranged to be spaced apart from each other (i.e., arranged at intervals). First connection ends of all the second insert plates 552 are connected to the third side 513 of the base plate 51, and distant from the first connection point a and the third connection point c at a certain distance, respectively, and second connection ends of all the second insert plates 552 are connected to the first side 511 of the base plate 51; the second connection end of the second insert plate 552 closest to the first insert plate 551 may be connected to the second connection point b.

In the above situation, after the board 10 is fixed in the casing 50 with such structure and then inserted into the chassis 00 through the casing 50, the wind enters from the front side of the casing 50. Part of the wind blows to the connection backplate 54 through a gap between the first insert plate 551 and the second insert plate 552 closest to the first insert plate 551, and is then exhausted through an opening in the connection backplate 54. The other part of the wind blows to the side wall of the chassis 00 opposite to the first side plate 52 through the hollowed-out pattern of the first side plate 52 after passing through a gap between two adjacent second insert plates 552 and a gap between the second insert plate 552 and the first side plate 52. Then, the direction of the wind changes, so that the wind blows from the first air vent (the air inlet) of the board 10 to the second air vent (the air outlet) to dissipate the heat of the board 10. Part of the wind exhausted from the second air vent of the board 10 is then exhausted through a gap between the first insert plate 551 and the second side plate 53 and a gap between the second side plate 53 and the side plate of the chassis 00 opposite to the second side plate 53. It should be noted here that dotted arrows shown in FIGS. 5 to 10 all refer to the direction of the wind passing through the casing 50; and solid arrows refer to the direction of the wind in the board 10 and the network board 30.

Figure 6:
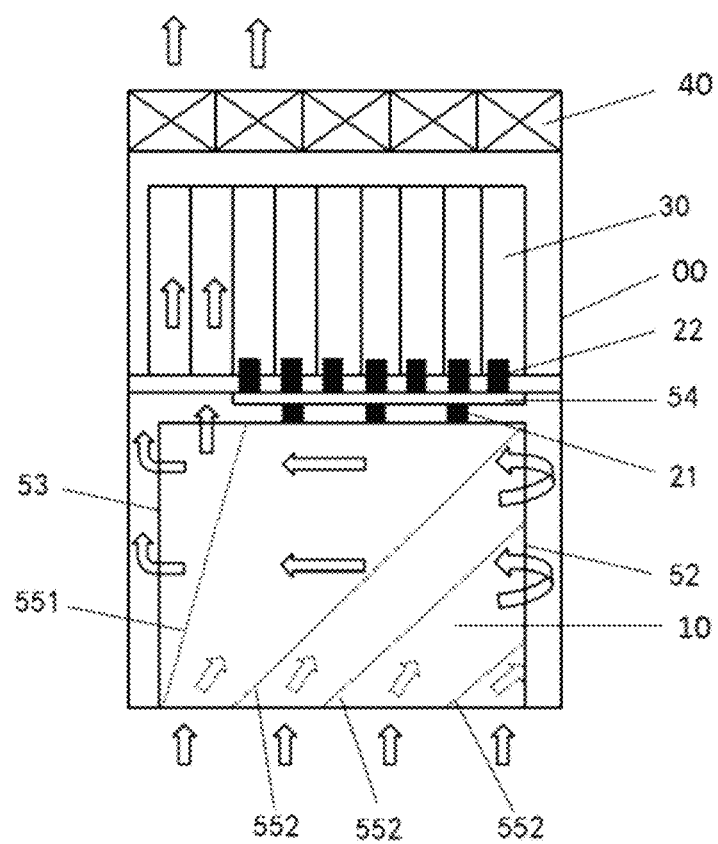
FIG. 6 is a top view of an electronic device with the casing shown in FIG. 5.

As shown in FIG. 6, the board 10 is inserted into the chassis 00 through the casing 50. In such case, a connector 21 of the board 10 and a connector 22 of the network board 30 are connected through the connection backplate 54 to form the orthogonal architecture of the electronic device. The fan 40 disposed on a side of the network board 30 away from the board 10 exhausts the air, exhausted from the board 10 into the front-rear air passages of the network board 30, to achieve the heat dissipation for the board 10 and the network board 30.

Figure 7:
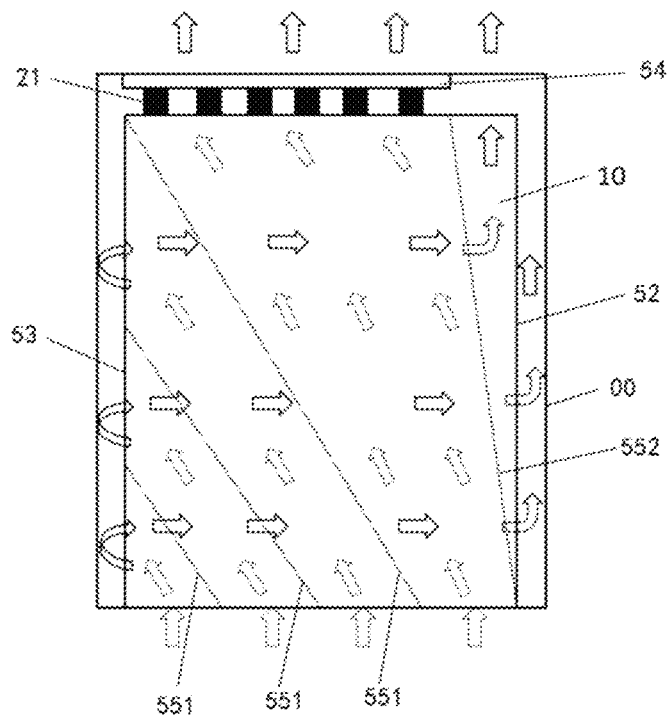
FIG. 7 is a top view of an example of a casing according to the present disclosure.

In an example, similar to the previous example, a difference is that the first air vent of the board 10, to which the casing 50 is adapted, is an air outlet, and the second air vent of the board 10 is an air inlet. As shown in FIG. 7, there are multiple insert plates in the casing 50, one of the insert plates is the second insert plate 552, and each remaining insert plate is the first insert plate 551; there may be one or more first insert plates 551. In FIG. 7, description is made by taking an example that there are three first insert plates 551. The connection backplate 54 of the casing 50 is connected on the fourth side 514 of the base plate 51, the second end of the connection backplate 54 is connected to the fourth connection point d, there is a certain distance between the first end of the connection backplate 54 and the second connection point b, and an opening is provided in the connection backplate 54. The connector of the board 10 is connected to the connection backplate 54. The first connection end of the second insert plate 552 is connected to the first connection point a, and the second connection end of the second insert plate 552 is connected to the fourth side 514 of the base plate 51 and corresponds to the first end of the connection backplate 54. The first insert plates 551 are arranged to be spaced apart from each other (i.e., arranged at intervals). First connection ends of all the first insert plates 551 are connected to the third side 513 of the base plate 51, and distant from the first connection point a and the third connection point c at a certain distance, respectively, and second connection ends of all the first insert plates 551 are connected to the second side 512 of the base plate 51; the second connection end of the first insert plate 551 closest to the second insert plate 552 may be connected to the fourth connection point d.

In the above situation, after the board 10 is fixed in the casing 50 with such structure and then inserted into the chassis 00 through the casing 50, the wind enters from the front side of the casing 50. Part of the wind blows to the connection backplate 54 through a gap between the second insert plate 552 and the first insert plate 551 closest to the second insert plate 552, and is then exhausted through the opening in the connection backplate 54. The other part of the wind blows to the side wall of the chassis 00 opposite to the second side plate 53 through the hollowed-out pattern of the second side plate 53 after passing through a gap between two adjacent first insert plates 551 and a gap between the first insert plate 551 and the second side plate 53. Then, the direction of the wind changes, and the wind blows from the first air vent (the air inlet) of the board 10 to the second air vent (the air outlet) to dissipate the heat of the board 10. Part of the wind exhausted from the second air vent of the board 10 is exhausted through a gap between the second insert plate 552 and the first side plate 52 and a gap between the first side plate 52 and the side plate of the chassis 00 opposite to the first side plate 52.

Figure 8:
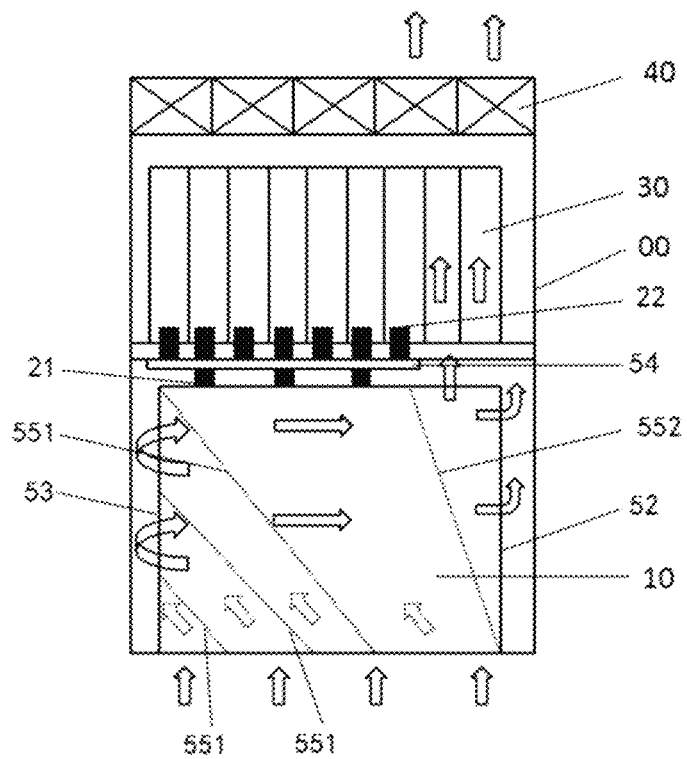
FIG. 8 is a top view of an electronic device with the casing shown in FIG. 7.

As shown in FIG. 8, the board 10 is inserted into the chassis 00 through the casing 50. In such case, the connector 21 of the board 10 and the connector 22 of the network board 30 are connected through the connection backplate 54 to form the orthogonal architecture of the electronic device. The fan 40 disposed on the side of the network board 30 away from the board 10 exhausts the air, exhausted from the board 10 into the front-rear air passages of the network board 30, to achieve the heat dissipation for the board 10 and the network board 30.

Figure 9:
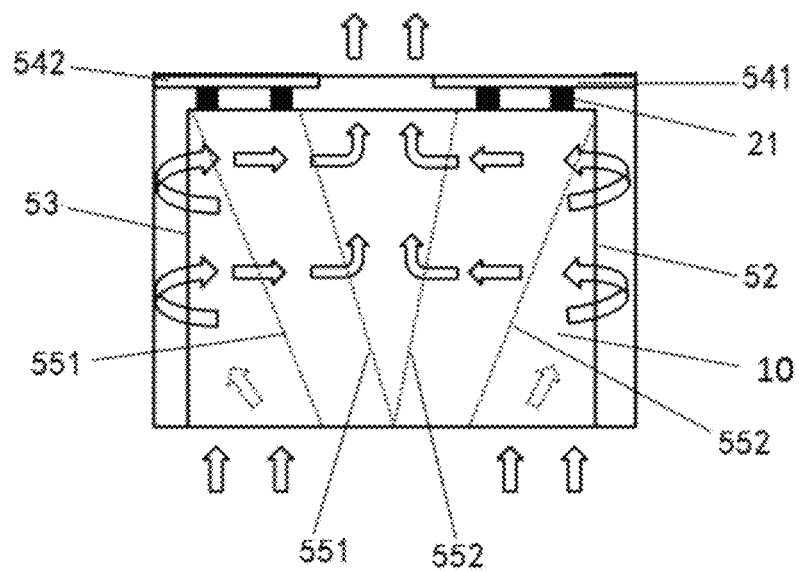
FIG. 9 is a top view of an example of a casing according to the present disclosure.

In an example, the first air vent and the second air vent of the board 10 are both air inlets. As shown in FIG. 9, the connection backplate 54 of the casing 50 includes a first connection sub-backplate 541 and a second connection sub-backplate 542 spaced apart from each other; the first connection sub-backplate 541 and the second connection sub-backplate 542 are both connected to the fourth side 514 of the base plate 51, a first end of the first connection sub-backplate 541 is connected to the second connection point b; a second end of the second connection sub-backplate 542 is connected to the fourth connection point d. There are multiple insert plates in the casing 50, some of the insert plates are first insert plates 551, and the remaining insert plates are second insert plates 552. In FIG. 9, there are two first insert plates 551 and two second insert plates 552. However, in practical applications, the number of the first insert plates 551 may be different from the number of the second insert plates 552. Either of the number of the first insert plates 551 or the number of the second insert plates 552 may be one, or three, or four, or even more. In the embodiment of the present disclosure, the number of the first insert plates 551 and the number of the second insert plates 552 each are not limited. Description is made by taking an example that there are two first insert plates 551 and two second insert plates 552. The two first insert plates 551 are arranged to be spaced apart from each other, and the two second insert plates 552 are arranged to be spaced apart from each other; first connection ends of the first insert plates 551 and the second insert plates 552 are all connected to the third side 513 of the base plate 51, and second connection ends of the first insert plates 551 and the second insert plates 552 are all connected to the fourth side 514 of the base plate 51; a distance from the first connection end of the first insert plate 551 to the first connection point a is greater than or equal to a distance from the first connection end of the second insert plate 552 to the first connection point a; a distance from the second connection end of the first insert plate 551 to the second connection point b is greater than or equal to a distance from the second connection end of the second insert plate 552 to the second connection point b. In an example, the first connection end of the first insert plate 551 and the first connection end of the second insert plate 552 adjacent to the first insert plate 551 are connected to a same point on the third side 513, the second connection end of the first insert plate 551 is connected to the fourth side 514 of the base plate 51 and corresponds to the first end of the second connection sub-backplate 542, and the second connection end of the second insert plate 552 is connected to the fourth side 514 of the base plate 51 and corresponds to the second end of the first connection sub-backplate 541.

In the above situation, after the board 10 is fixed in the casing 50 with such structure and then inserted into the chassis 00 through the casing 50, the wind enters from the front side of the casing 50. Part of the wind blows to the first insert plates 551, and then the direction of the wind changes, the wind is exhausted through the hollowed-out pattern of the second side plate 53 and blows to the side wall of the chassis 00 opposite to the second side plate 53, then the direction of the wind changes again and the wind enters the second air vent of the board 10; the other part of the wind blows to the second insert plates 552, and then the direction of the wind changes, the wind is exhausted through the hollowed-out pattern of the first side plate 52 and blows to the side wall of the chassis 00 opposite to the first side plate 52, then the direction of the wind changes again and the wind enters the first air vent of the board 10; the air entering from the first air vent and the second air vent dissipates the heat of the board 10, and then is exhausted through a gap between the first connection sub-backplate 541 and the second connection sub-backplate 542.

Figure 10:
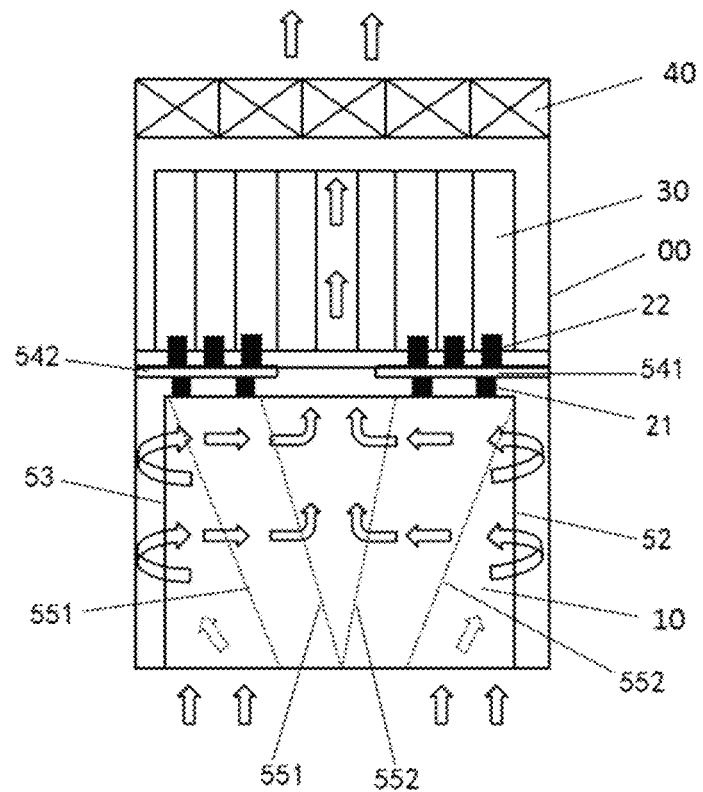
FIG. 10 is a top view of an electronic device with the casing shown in FIG. 9.

As shown in FIG. 10, the board 10 is inserted into the chassis 00 through the casing 50. In such case, the connector 21 of the board 10 and the connector 22 of the network board 30 are connected through the connection backplate 54 to form the orthogonal architecture of the electronic device. The fan 40 disposed on the side of the network board 30 away from the board 10 exhausts the air, exhausted from the board 10 into the front-rear air passages of the network board 30, to achieve the heat dissipation for the board 10 and the network board 30.

In a second aspect, with reference to FIGS. 11 to 15, an embodiment of the present disclosure provides an electronic device including the casing 50 mentioned above, the board 10 disposed in the casing 50, and the network board 30 connected to the board 10; the board 10 and the network board 30 are in an orthogonal architecture. Specifically, the board 10 is connected to the connection backplate 54 of the casing 50 through the connector 21; the network board 30 is connected to the connection backplate 54 of the casing 50 through the connector 22. In the embodiment of the present disclosure, the electronic device may be a router.

The electronic device in the embodiment of the present disclosure includes the casing 50 mentioned above, the casing 50 is adapted to the board 10 with the left-right air passages, and the casing 50 is provided with the insert plate, and the insert plate is inclined relative to the base plate 51 (for example, the extension direction in which the insert plate extends intersects with the extension directions in which the first side 511 and the third side 513 of the base plate 51 extend). Therefore, after the board 10 is inserted into the chassis 00 through the casing 50, and after the fan 40 on the rear side of the chassis 00 is turned on, the wind enters from the front side of the chassis 00 and blows to the insert plate under the action of the fan 40; and due to the influence of the insert plate, after the wind blows from the hollowed-out pattern of the first side plate 52 to the side wall of the chassis 00 opposite to the first side plate 52, the direction of the wind changes, and in such case, the wind blows from the first air vent of the board 10 to the second air vent of the board 10 to dissipate the heat of the board 10. That is to say, if the board 10 with the left-right air passages is fixed to the casing 50, and then is applied to the electronic device with the orthogonal architecture, good heat dissipation can be achieved.

In some implementations, the electronic device further includes the fan 40 disposed in the chassis 00 for dissipating the heat of the board 10 and the network board 30.

Figure 11:
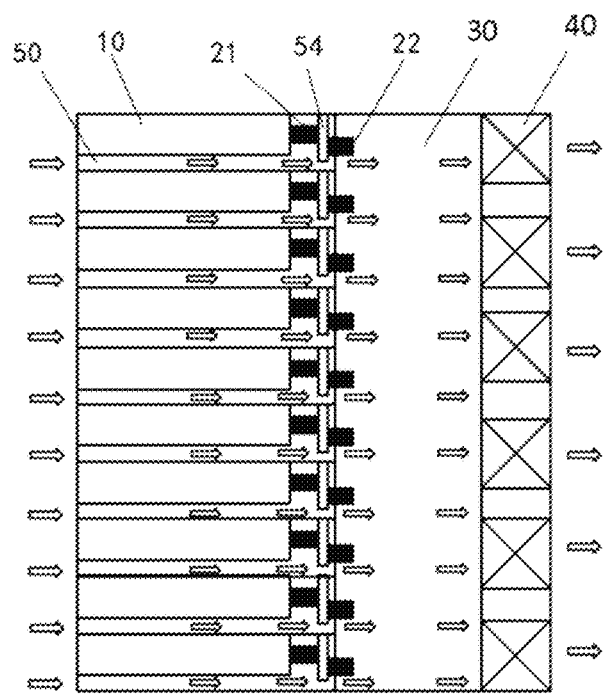
FIG. 11 is a schematic diagram of an example of an electronic device according to the present disclosure.
Figure 12:
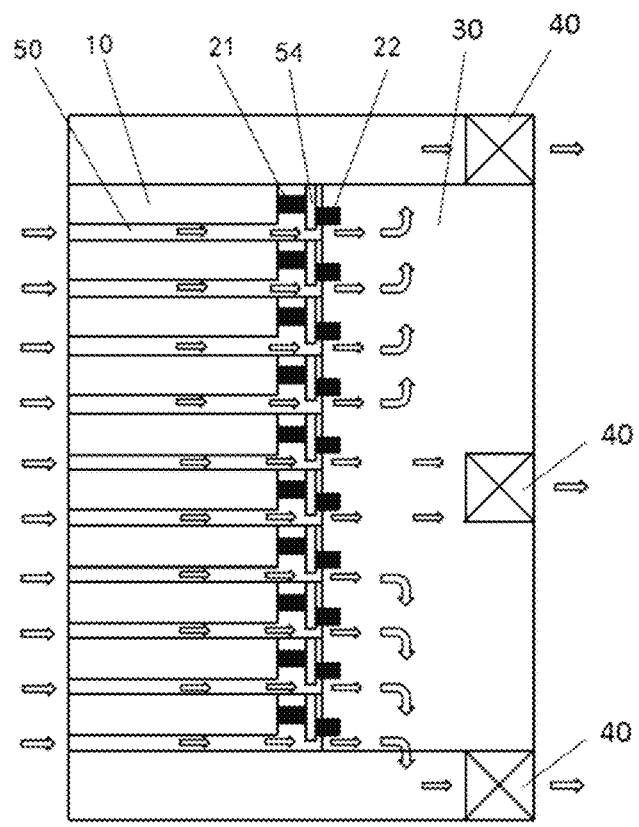
FIG. 12 is a schematic diagram of an example of an electronic device according to the present disclosure.

In an example, as shown in FIG. 11, multiple fans 40 arranged side by side are provided on the side of the network board 30 away from the board 10. In this case, since the number of the fans 40 is relatively large, it is beneficial to the heat dissipation of the board 10 and the network plate 30, and good heat dissipation effect is achieved. Certainly, energy consumption of the fans 40 may be considered, so that the number of the fans 40 and installation regions of the fans 40 can be reasonably set; the fans 40 may be installed in three regions, as shown in FIG. 12, two fan 40 are disposed on the side of the network board 30 away from the board 10 and at corners of the chassis 00, respectively, and one fan 40 is disposed in a center region of the chassis 00.

Figure 13:
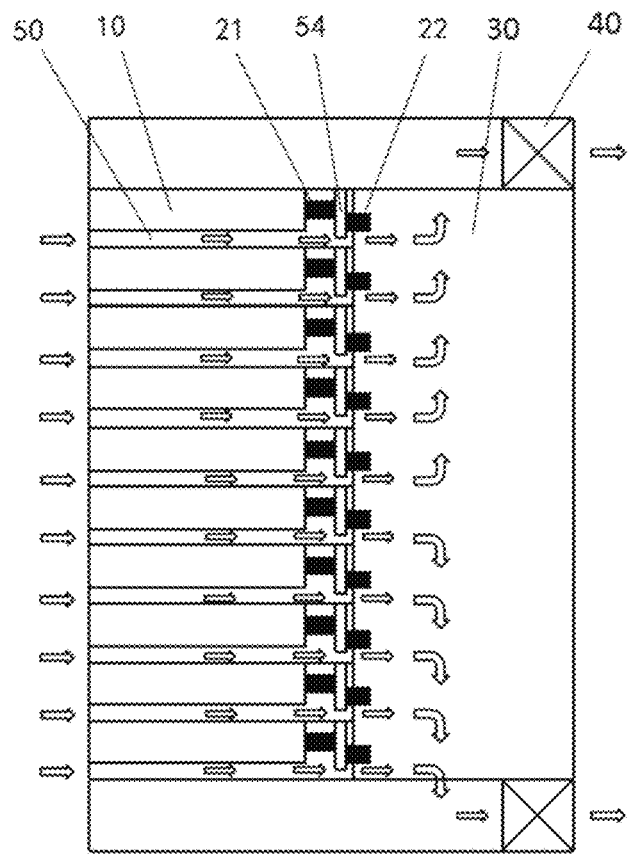
FIG. 13 is a schematic diagram of an example of an electronic device according to the present disclosure.
Figure 14:
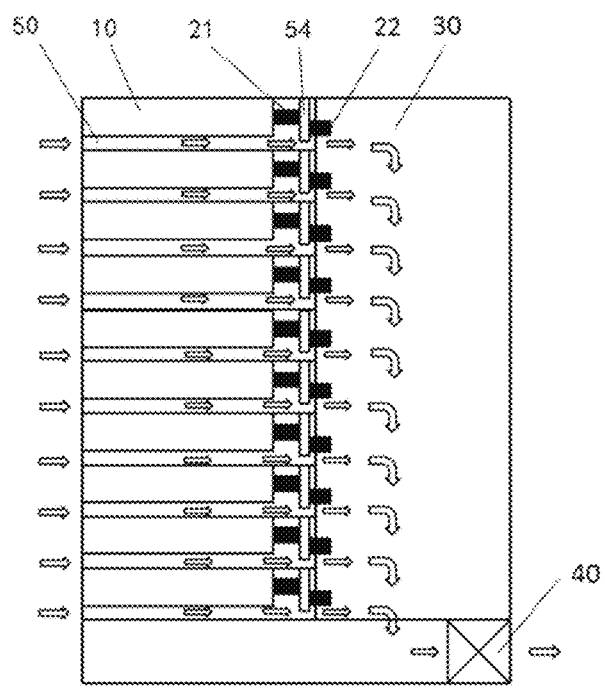
FIG. 14 is a schematic diagram of an example of an electronic device according to the present disclosure.
Figure 15:
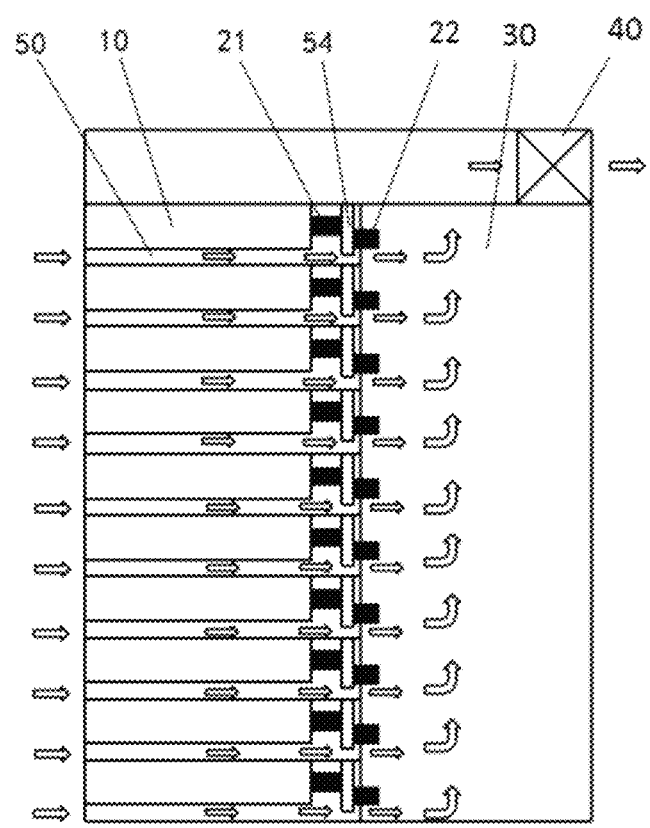
FIG. 15 is a schematic diagram of an example of an electronic device according to the present disclosure.

In an example, as shown in FIG. 13, the fans 40 are disposed in two regions. The fans 40 in the two regions are disposed on the side of the network board 30 away from the board 10 and at the corners of the chassis 00, respectively. In this case, the number of the fans 40 is relatively small, power consumption is reduced and the heat dissipation of the board 10 and the network board 30 is achieved. Certainly, as shown in FIGS. 14 and 15, one region may be disposed therein with the fan 40. For example, the fan 40 is disposed on the side of the network board 30 away from the board 10 and at a corner of the chassis 00.

Exemplary embodiments of the present disclosure have been described above with reference to the accompanying drawings, which are not intended to limit the protection scope of the present disclosure. Any modification, equivalent substitution and improvement made by those skilled in the art without departing from the scope and spirit of the present disclosure fall within the protection scope of the present disclosure.

What is claimed is:

1. A casing, adapted to a board having a first air vent and a second air vent, comprising:
    a base plate having a first side and a second side opposite to each other, and a third side and a fourth side opposite to each other and connected between the first side and the second side;
    a first side plate and a second side plate provided on the first side and the second side of the base plate, respectively, with both the first side plate and the second side plate having hollowed-out patterns, and after the board being fixed in the casing, the first side plate being opposite to the first air vent of the board, and the second side plate being opposite to the second air vent of the board;
    a connection backplate provided on the fourth side of the base plate; and
    at least one insert plate provided on the base plate, with an extension direction in which the insert plate extends intersecting with an extension direction in which the third side of the base plate extends.

2. The casing of claim 1, wherein a connection point at which the first side and the third side are connected is a first connection point; a connection point at which the first side and the fourth side are connected is a second connection point; a connection point at which the second side and the third side are connected is a third connection point; a connection point at which the second side and the fourth side are connected is a fourth connection point;

a first end of the connection backplate is connected to the second connection point, and there is a certain distance between a second end of the connection backplate and the fourth connection point;

a first connection end of at least one insert plate is connected to the third side, and distant from the third connection point at a certain distance, and a second connection end of the insert plate is connected to the first side.

3. The casing of claim 2, wherein multiple insert plates are provided, one of the multiple insert plates is a first insert plate, and each remaining insert plate is a second insert plate;

the first connection end of the first insert plate is connected to the third connection point, the second connection end of the first insert plate is connected to the second end of the connection backplate, and the connection backplate has an opening therein;

the first connection end of the second insert plate is connected to the third side, and distant from the third connection point at a certain distance, and the second connection end of the second insert plate is connected to the first side.

4. The casing of claim 3, wherein multiple second insert plates are provided, the multiple second insert plates are arranged to be spaced apart from each other, and the second connection end of one of the multiple second insert plates is connected to the second connection point.

5. The casing of claim 1, wherein a connection point at which the first side and the third side are connected is a first connection point; a connection point at which the first side and the fourth side are connected is a second connection point; a connection point at which the second side and the third side are connected is a third connection point; a connection point at which the second side and the fourth side are connected is a fourth connection point;

a first end of the connection backplate is connected to the fourth connection point, and there is a certain distance between a second end of the connection backplate and the second connection point;

a first connection end of at least one insert plate is connected to the third side, and distant from both the first connection point and the third connection point at a certain distance, and a second connection end of the insert plate is connected to the second side.

6. The casing of claim 5, wherein multiple insert plates are provided, one of the multiple insert plates is a first insert plate, and each remaining insert plate is a second insert plate;

the first connection end of the first insert plate is connected to the first connection point, the second connection end of the first insert plate is connected to the second end of the connection backplate, and the connection backplate has an opening therein;

the first connection end of the second insert plate is connected to the third side, and distant from both the first connection point and the third connection point at a certain distance, and the second connection end of the second insert plate is connected to the second side.

7. The casing of claim 6, wherein multiple second insert plates are provided, the multiple second insert plates are arranged to be spaced apart from each other, and the second connection end of one of the multiple second insert plates is connected to the fourth connection point.

8. The casing of claim 1, wherein a connection point at which the first side and the third side are connected is a first connection point; a connection point at which the first side and the fourth side are connected is a second connection point; a connection point at which the second side and the third side are connected is a third connection point; a connection point at which the second side and the fourth side are connected is a fourth connection point;

the connection backplate comprises a first connection sub-backplate and a second connection sub-backplate, the first connection sub-backplate and the second connection sub-backplate are spaced apart from each other and are both connected to the fourth side of the base plate;

a first end of the first connection sub-backplate is connected to the second connection point; and a second end of the second connection sub-backplate is connected to the fourth connection point.

9. The casing of claim 8, wherein multiple insert plates are provided, part of the multiple insert plates are first insert plates, and the other part of the multiple insert plates are second insert plates;

a first connection end of the first insert plate and a first connection end of the second insert plate are both connected to the third side; a second connection end of the first insert plate and a second connection end of the second insert plate are both connected to the fourth side; a distance from the first connection end of the first insert plate to the first connection point is greater than or equal to a distance from the first connection end of the second insert plate to the first connection point; and a distance from the second connection end of the first insert plate to the second connection point is greater than a distance from the second connection end of the second insert plate to the second connection point;

a spacing between the second connection end of the first insert plate and the second connection end of the second insert plate adjacent to the first insert plate is opposite to a spacing between the first connection sub-backplate and the second connection sub-backplate.

10. An electronic device, comprising the casing and the board in claim 1, wherein the board is fixed in the casing.

11. The electronic device of claim 10, further comprising a network board, wherein the network board and the board are arranged in an orthogonal architecture.

12. The electronic device of claim 11, wherein both the network board and the board are disposed in a chassis, and a fan is provided on a side of the chassis close to the network board.

* * * * *